(12) United States Patent
McCarten et al.

(10) Patent No.: US 7,965,329 B2
(45) Date of Patent: Jun. 21, 2011

(54) HIGH GAIN READ CIRCUIT FOR 3D INTEGRATED PIXEL

(75) Inventors: John P. McCarten, Penfield, NY (US);
Joseph R. Summa, Hilton, NY (US);
Todd J. Anderson, Fairport, NY (US);
Cristian A. Tivarus, Pittsford, CT (US)

(73) Assignee: OmniVision Technologies, Inc., Santa Clara, CA (US)

( * ) Notice: Subject to any disclaimer, the term of this patent is extended or adjusted under 35 U.S.C. 154(b) by 386 days.

(21) Appl. No.: 12/206,919

(22) Filed: Sep. 9, 2008

(65) Prior Publication Data
US 2010/0060764 A1 Mar. 11, 2010

(51) Int. Cl.
*H04N 5/335* (2011.01)
(52) U.S. Cl. ........................................................ 348/308
(58) Field of Classification Search .................. 348/294, 348/308, 300; 250/208.1; 438/57, 65
See application file for complete search history.

(56) References Cited

U.S. PATENT DOCUMENTS

| 5,164,831 | A | 11/1992 | Kuchta et al. | |
|---|---|---|---|---|
| 6,642,081 | B1 * | 11/2003 | Patti | 438/109 |
| 7,745,250 | B2 * | 6/2010 | Han | 438/57 |
| 2007/0018075 | A1 * | 1/2007 | Cazaux et al. | 250/208.1 |
| 2010/0248412 | A1 * | 9/2010 | Guidash | 438/65 |

FOREIGN PATENT DOCUMENTS

| GB | 2 319 394 A | 5/1998 |
|---|---|---|
| WO | WO 2004/038810 A2 | 5/2004 |
| WO | WO 2006/109937 A1 | 10/2006 |

* cited by examiner

*Primary Examiner* — Tuan Ho
(74) *Attorney, Agent, or Firm* — Blakely Sokoloff Taylor & Zafman LLP

(57) ABSTRACT

An image sensor includes (a) a first wafer having (i) a photosensitive area; (ii) a charge-to-voltage conversion region; (b) a second wafer having (i) a first amplifier that receives a signal from the charge-to-voltage conversion region; (c) an electrical interconnect connecting the charge-to-voltage conversion region to an input of the amplifier; (d) an electrically biased shield at least partially enclosing at least a portion of the electrical interconnect.

10 Claims, 10 Drawing Sheets

HIGH GAIN READ CIRCUIT FOR 3D INTEGRATED PIXEL

The present invention relates to CMOS image sensing devices fabricated with active components on two or more wafers, and more specifically, to reducing the amount of signal noise with these types of imaging sensing devices.

BACKGROUND OF THE INVENTION

In general, as pixels made using CMOS processes scale to smaller dimensions, some performance properties of these smaller pixels degrade. Specifically, the photodiode capacity decreases. This reduces the dynamic range of the image sensor.

Some of the photodiode capacity can be gained back by moving from a non-shared pixel design as illustrated in FIG. 1 to a shared pixel design like the 4-shared pixel design illustrated in FIG. 2. The non-shared design of FIG. 1 includes a photodiode 1 that collects charge in response to light, and a transfer gate 2 for transferring charge from the photodiode 1 to a floating diffusion 3. A source follower amplifier 5 senses the charge, and in response, the source follower amplifier 5 passes its output signal onto an output line 8 via an output 9. A reset transistor 4 resets the floating diffusion 3 to a predetermined signal level, and a row select transistor 7 is selectively activated for passing the output of the source follower amplifier 5 to the output line 8.

Referring to FIG. 2, there is shown the shared pixel design having the same components as the non-shared except that the reset transistor 4, source follower amplifier 5, and row select transistor 7 are shared by multiple photodiodes 11, 12, 13 and 14 whose charge is transferred respectively by transfer gates 15, 16, 17 and 18. This reduces the number of transistors per pixel, which allows for a larger photodiode area and therefore a large photodiode capacity.

One drawback of shared pixel approach is an increase in the capacitance of the floating diffusions 19, 20, 21, and 22. Each pixel in the kernel adds capacitance since the floating diffusion nodes are wired together in parallel. As defined herein, a kernel is defined as the group of pixels sharing the same floating diffusion. Increasing the floating diffusion capacitance decreases the voltage-to-charge conversion ratio into the source follower amplifier 5. Increasing floating diffusion capacitance increases the electron read noise. Increasing electron read noise reduces dynamic range. However, for most applications, the positive benefits of increasing the photodiode area by moving to shared pixel architectures outweigh the negatives.

Feedback can be used to effectively reduce floating diffusion capacitance. As illustrated in FIG. 3a, there is shown the shared design as in FIG. 2 except that the floating diffusion wire 31 interconnecting the floating diffusions is physically above a shielding wire 30 as illustrated in FIG. 3b. The shielding wire 30 is electrically connected to the output 9 of the source follower (SF) amplifier 5. In another configuration not shown, the shielding wire is instead connected to Vout 8 of the row select transistor 7. Because the signal of output 9 follows the voltage on the floating diffusions 19, 20, 21, 22 with almost unity gain, the voltage on the shield follows the voltage on the floating diffusion. By shielding the floating diffusion wire 31 with a shield biased at Vout, the parasitic capacitance of the floating diffusion interconnect is reduced, resulting in an increase in the voltage-to-charge conversion ratio.

Recently, there has been a flurry of activity in 3D integration of the pixel by stacking two or more silicon wafers with electrical interconnects between the two wafers. An embodiment of this technology is illustrated in FIG. 4. This embodiment is the same as FIG. 2 except that the photodiodes 23a, 23b, 24a, and 24b and transfer gates 25a, 25b, 26a, and 26b are on the sensor wafer 40, and the remaining transistors are moved from the sensor wafer (SW) 40 and onto the circuit wafer (CW) 41 below the pixel. The photodiodes 23a, 23b, 24a, and 24b are contained in an active layer (silicon) 42 bounded by two dielectric layers 43 and 54. Moving the transistors to the active layer (silicon) 67 on the CW 41 increases the photodiode (PD) area, which increases PD capacity, and hence dynamic range. However, one of the negative aspects of this approach is that there is more parasitic floating diffusion capacitance due to the electrical interconnect 55 and electrical interconnect wire 52 between the two wafers.

Another negative of the 3D approaches illustrated in FIG. 4 is that there is more cross capacitance between floating diffusion wires, which leads to more electrical cross talk.

Consequently, a need exists for a pixel design which overcomes the above-described drawbacks.

SUMMARY OF THE INVENTION

The present invention is directed to overcoming one or more of the problems set forth above. Briefly summarized, a metal wire interconnecting the floating diffusion on the sensor wafer with the transistors on the circuit wafer is surrounded by a metal shield. The metal shield is connected to an amplifier with gain greater than zero. The output of this amplifier follows the voltage on the floating diffusion node. This reduces the floating diffusion capacitance. The shield also reduces almost all unwanted electrical coupling between adjacent floating diffusions thereby minimizing electrical crosstalk.

BRIEF DESCRIPTION OF THE DRAWINGS

The above and other objects, features and advantages of the invention will become more apparent by reference to the following detailed description of the invention taken in conjunction with the accompanying drawings, wherein.

DETAILED DESCRIPTION OF THE INVENTION

Figure 5:
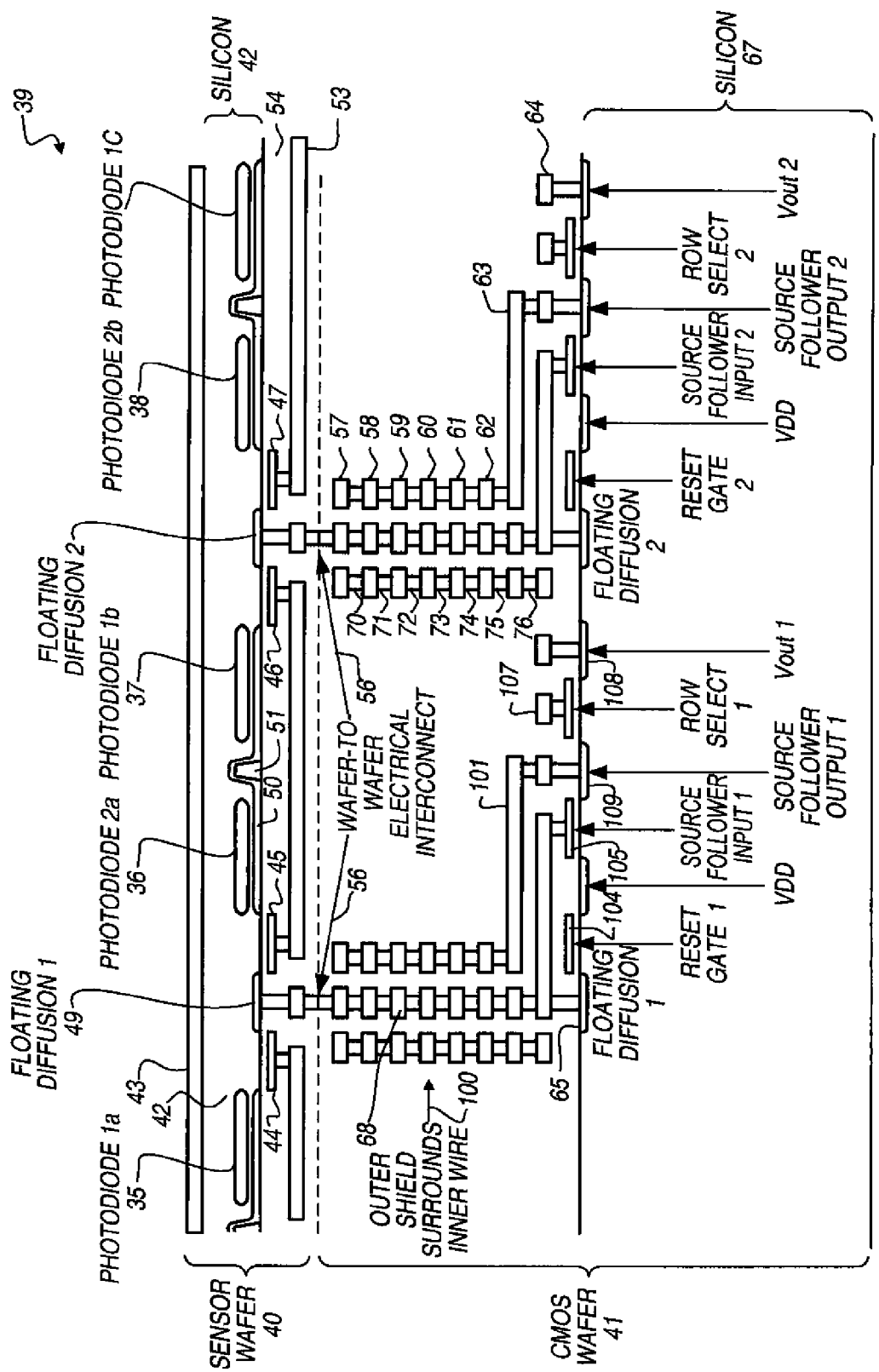
FIG. 5 shows the first embodiment of this invention. An electrically conducting shield surrounds the wire electrically interconnecting the two wafers. The shield is driven by the output of the source-follower transistor to reduce floating diffusion capacitance.
Figure 6:
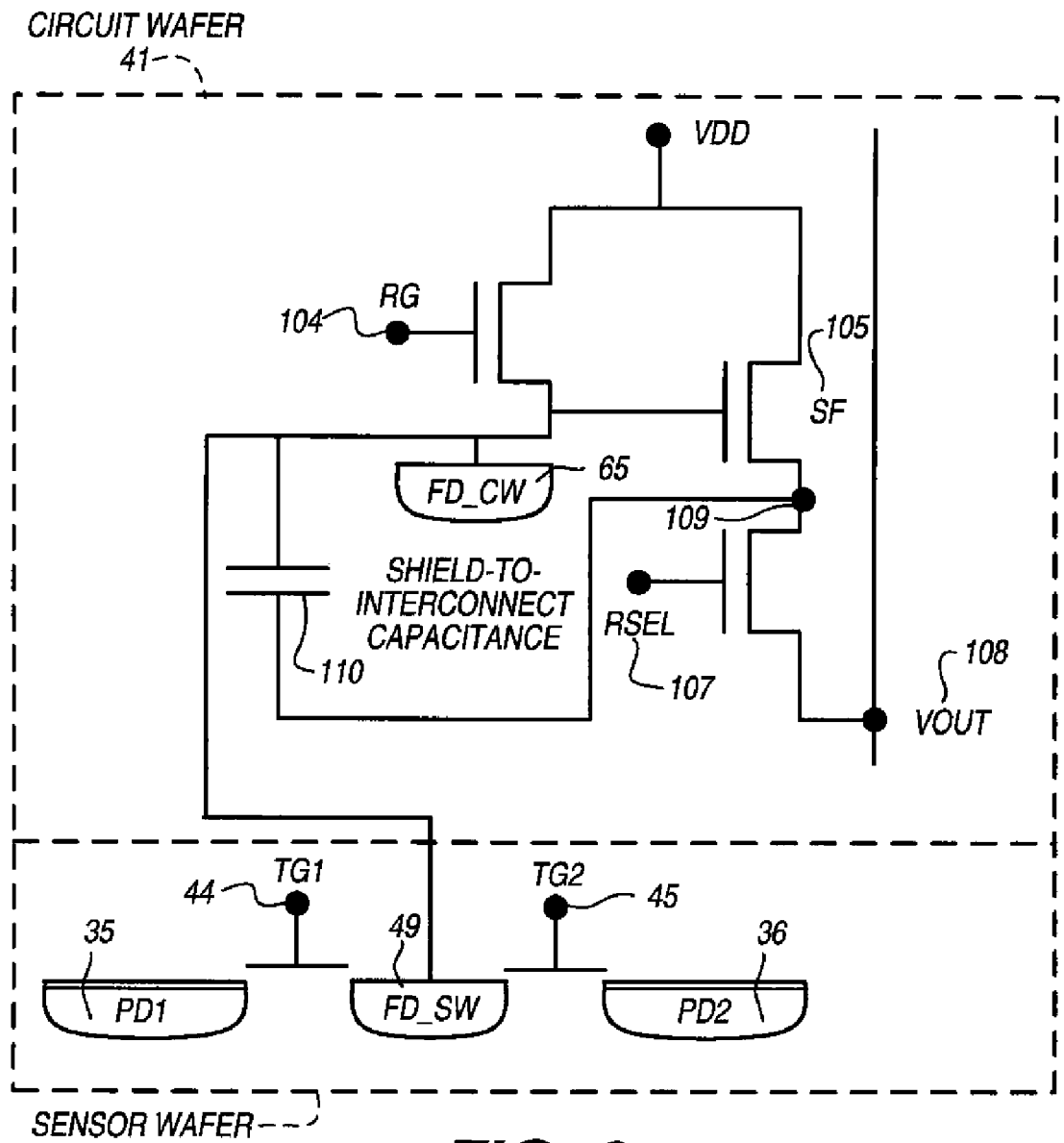
FIG. 6 is a schematic corresponding to a single kernel of FIG. 6.

As illustrated in FIGS. 5 and 6, there is shown the image sensor 39 of the present invention. The image sensor 39 includes a sensor wafer 40 and a circuit wafer 41. It is noted that FIG. 6 shows only two photosensitive regions, preferably photodiodes, 35 and 36 and one transfer gate 44 and 45 for simplicity of illustration. FIG. 5 illustrates another set of these components to illustrate the repeating nature of the pixel array in both structure and function. The sensor wafer 40 includes four photosensitive regions 35, 36, 37 and 38, preferably photodiodes, each of which collect charge in response to incident light. The sensor wafer 40 also includes transfer gates 44, 45, 46 and 47 that are respectively associated with each photodiode 35, 36, 37 and 38. Transfer gates 44 and 45 selectively and respectively passes charge from the photodiodes 35 and 36 to the charge-to-voltage conversion region 49, preferably a floating diffusion 49. The sensor wafer 40 is built in a process that is optimized for photodiode performance. The kernel that is formed on the sensor wafer 40 contains only photodiodes 35 and 36 that feed one floating diffusion node 49, transfer gates 44 and 45 between the photodiodes 35 and 36 and the one floating diffusion node 49, and isolation 51 (FIG. 5) of the photodiodes and floating diffusions from the other photodiodes 37 and 38. A single layer of metallization 53 provides wiring to the transfer gates 44, 45, 46, and 47. If necessary, two or more layers of metal can be included on the sensor wafer 40 for transfer gate wiring.

The thinned sensor wafer 40 is electrically connected via connector 56 to a circuit wafer 41. The electrical interconnect 68 connecting floating diffusions 49, 65 between the sensor wafer 40 and the circuit wafer 41 is surrounded by a metal shield 100. The metal shield 100 consists of metal segments in each metal layer 57-64, and electrical interconnects between metal layers 70-76 on the circuit wafer 41. The metal shield 100 is electrically connected via electrical connector 101 to the output 109 of the source follower amplifier 105, reducing the effective capacitance of the floating diffusion. Another benefit of the metal shield 100 is that it reduces the capacitive coupling between adjacent wires of the electrical interconnect 68 that interconnect floating diffusions 49, 65, and therefore reduces electrical crosstalk.

The circuit wafer 41 includes another charge-to-voltage conversion region, preferably the floating diffusion 65 that, in combination with the floating diffusion 49, collectively convert the charge passed to the floating diffusion 49 to a voltage. The source follower amplifier 105 on the circuit wafer 41 amplifies the voltage that is output on the output line 108. The circuit wafer 41 also includes a reset gate 104 that resets the voltage on the floating diffusion 65 to a predetermined level. The circuit wafer 41 further includes a row select transistor 107 for selectively permitting the output 109 of the source follower 105 to be passed to the output line 108.

For the above embodiment, the kernel consists of two photodiodes. However, the kernel on the sensor wafer 40 may consist of just one photodiode, or three or more photodiodes.

Figure 1:
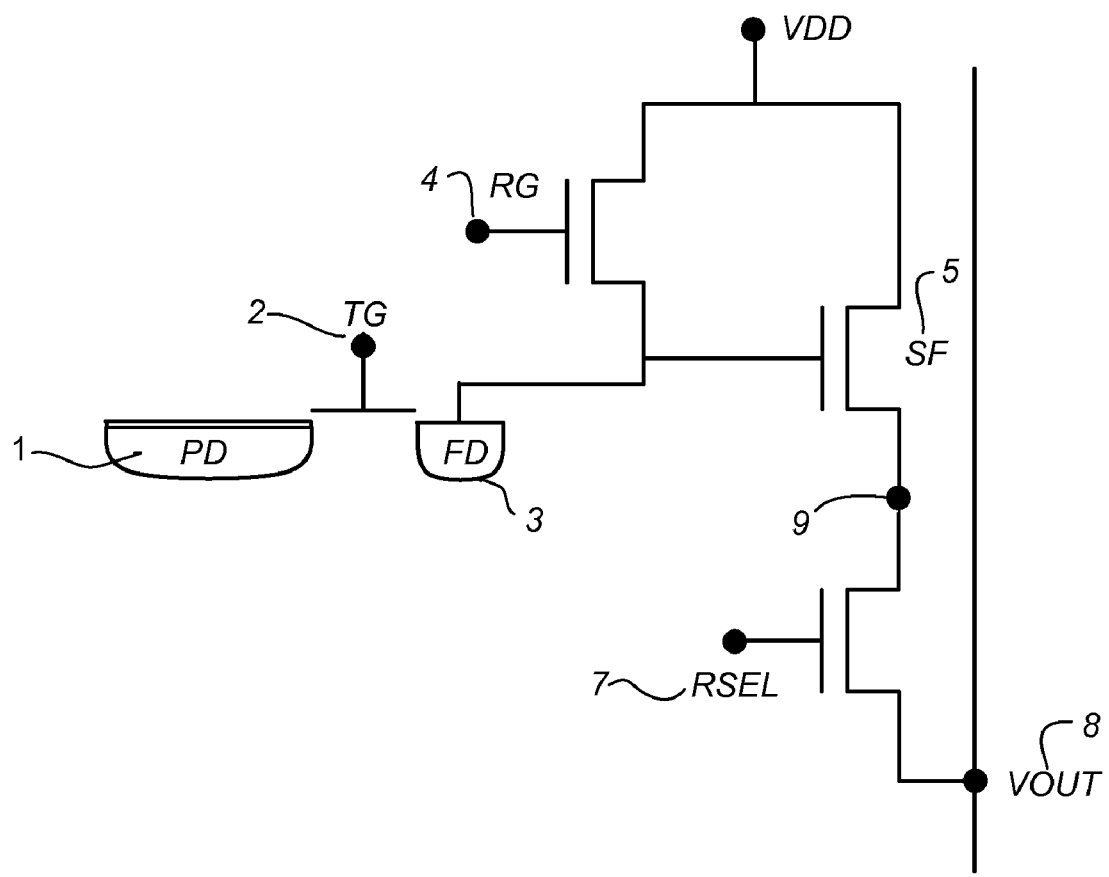
FIG. 1 shows prior art of a non-shared pixel schematic.
Figure 2:
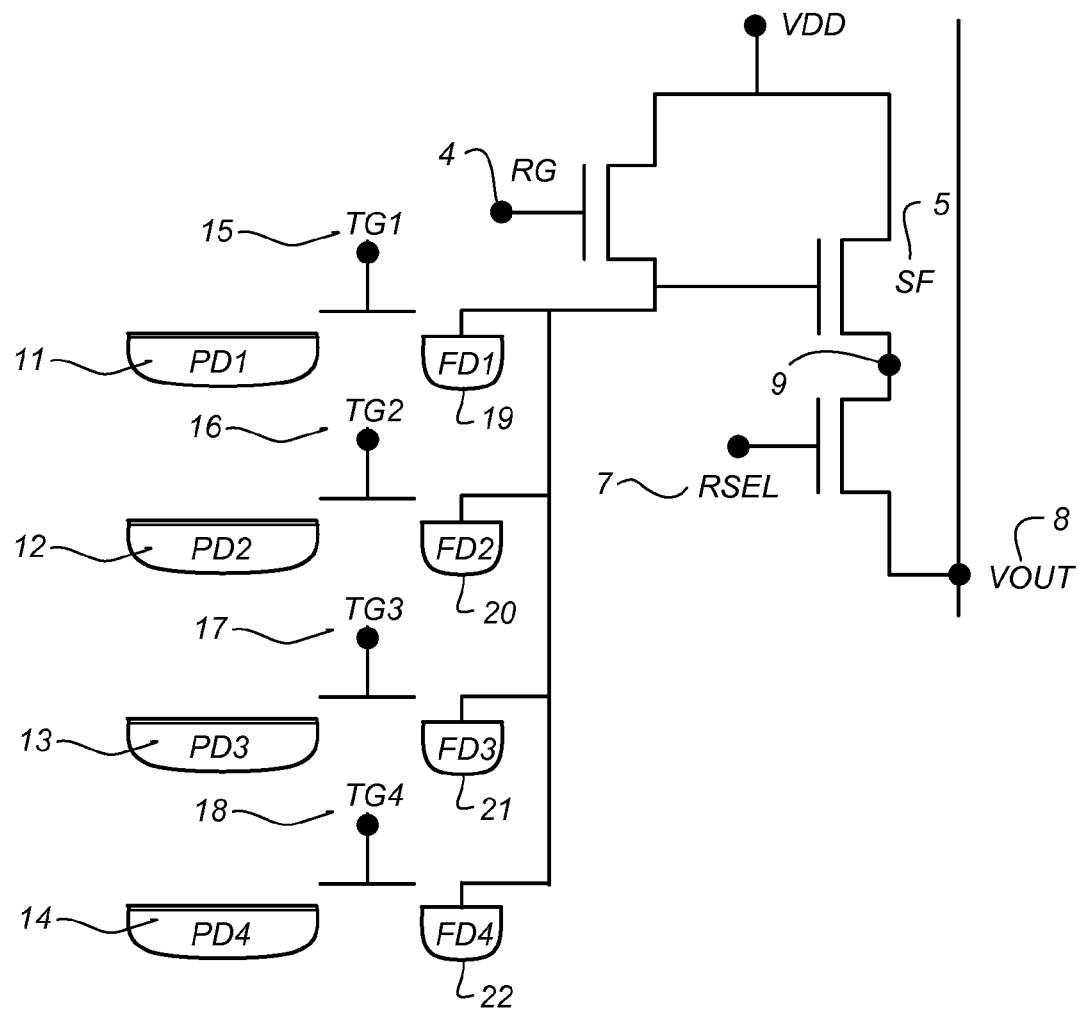
FIG. 2 shows prior art of a 4-shared pixel schematic.
Figures 3A, 3B:
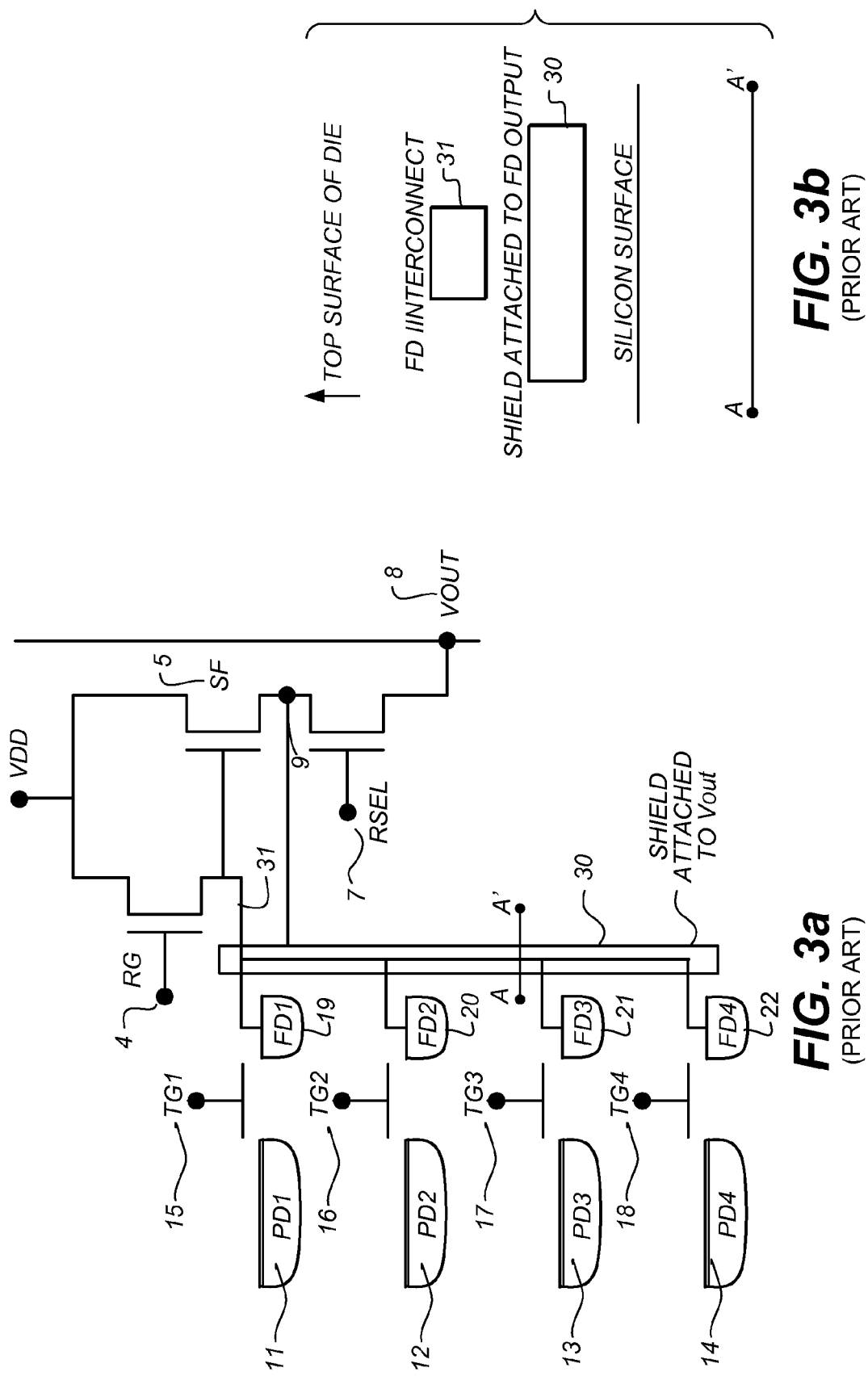
FIG. 3a shows prior art of a 4-shared pixel schematic with feedback to reduce floating diffusion capacitance.
FIG. 3b is a cross section of FIG. 3a through A-A.
Figure 4:
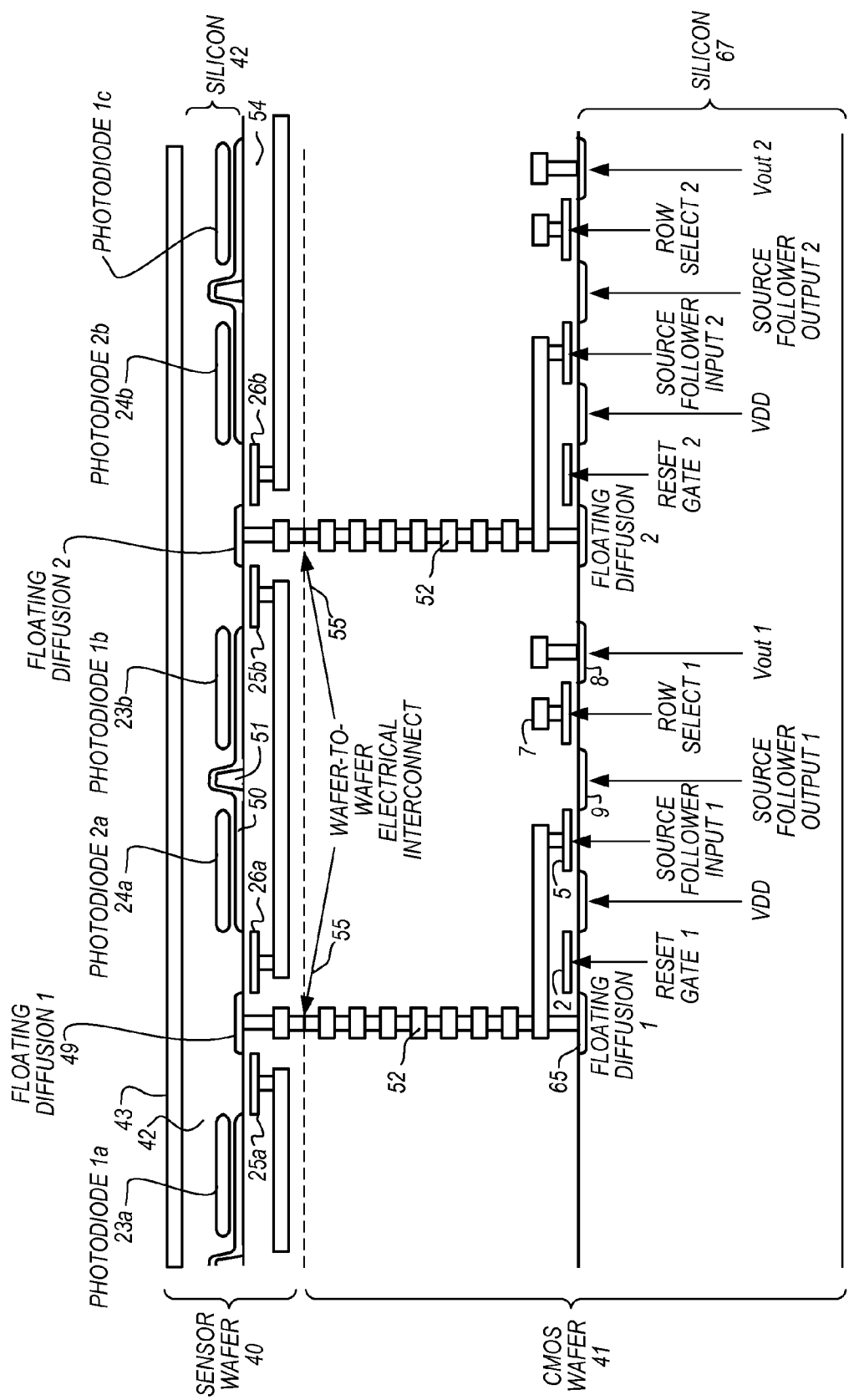
FIG. 4 shows prior art of a cross-section of a pixel fabricated using wafer-to-wafer stacking with electrical interconnects.
Figure 7:
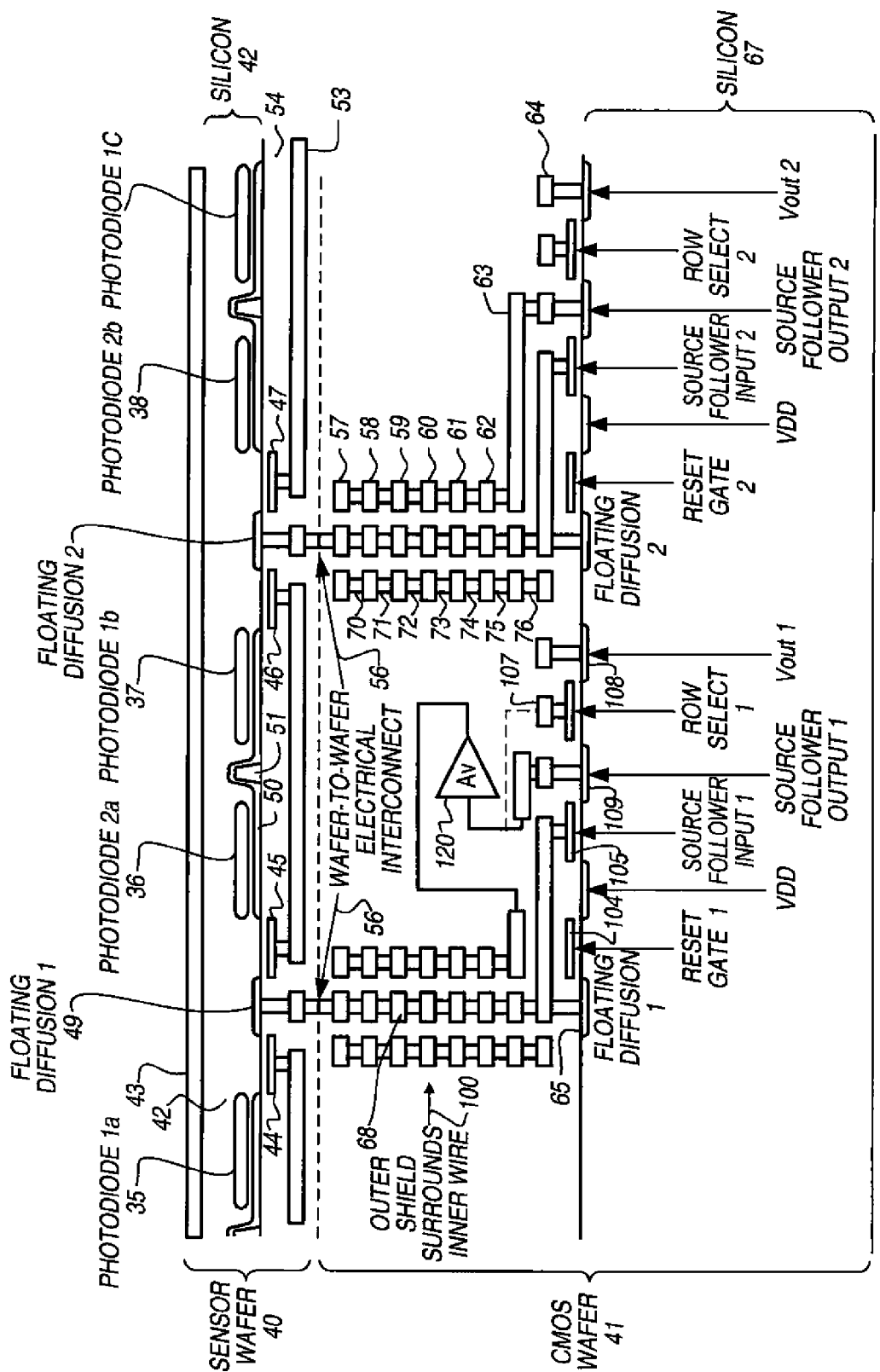
FIG. 7 shows the second embodiment of this invention. The shield is driven with an amplifier with voltage gain greater than unity to further reduce floating diffusion capacitance.
Figure 8:
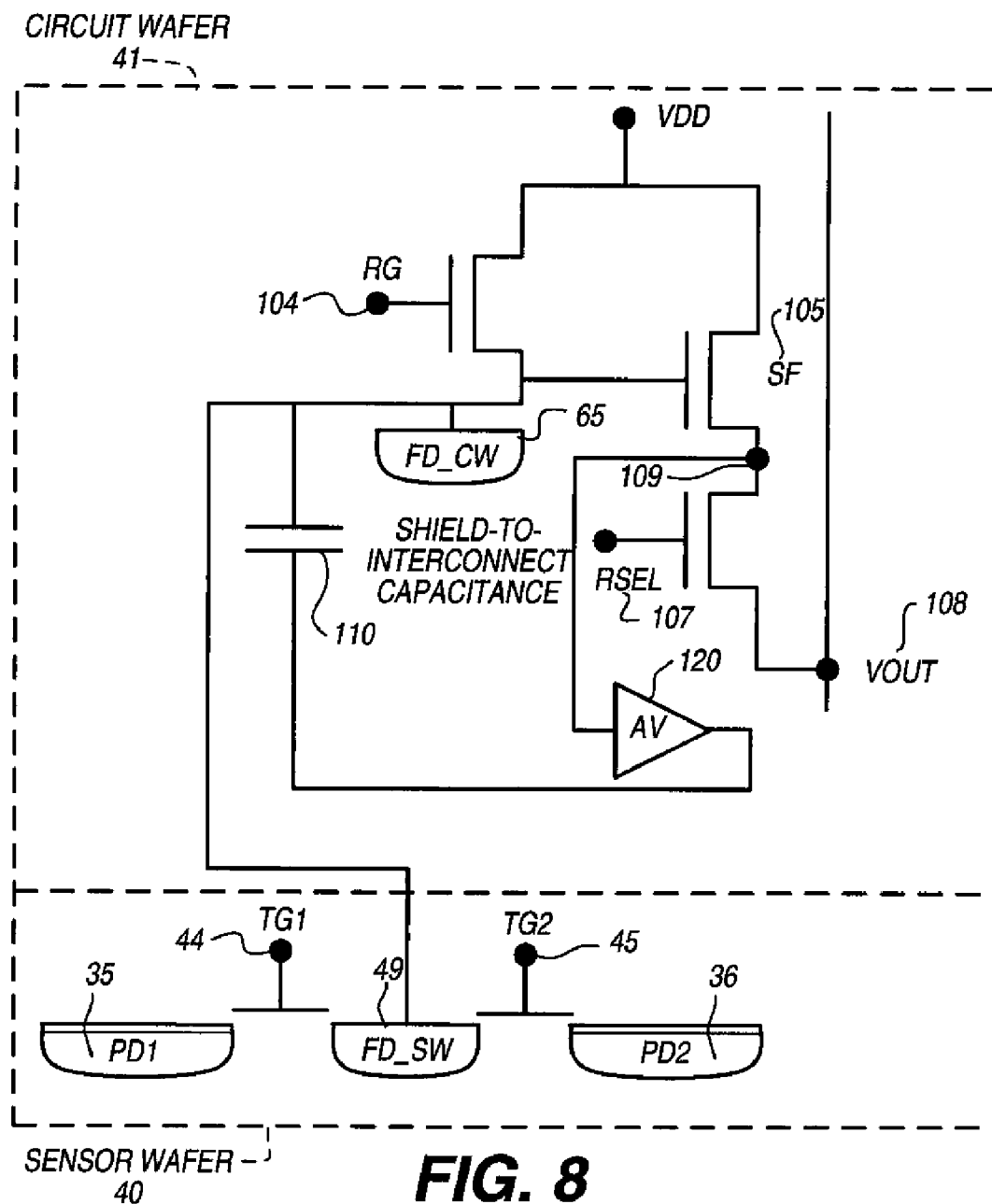
FIG. 8 shows the schematic corresponding to a single kernel of FIG. 8.

For most four transistor (4T-pixel) designs, a source follower amplifier, like those shown in FIGS. 1-3, is used to drive the large capacitance of the column circuit. However, the voltage amplification of a source follower circuit is less than one. FIGS. 7 and 8 illustrate a second embodiment that amplifies the voltage applied to the metal shield 100 surrounding the wafer-to-wafer electrical interconnect 68. This reduces the effective capacitance of the floating diffusion 49 and 65. It is noted that this embodiment is the same as FIG. 7 except that a voltage amplifier 120 is attached between the metal shield 100 and the output 109 of the source follower amplifier 105. More specifically, the input of the voltage amplifier 120 is connected to the output 109 of the source follower amplifier 105. Alternatively, the input of the voltage amplifier 120 is connected to the output of the row select transistor 107 (see dashed line). The input voltage to the amplifier 120 needs to be proportional to the charge on the floating diffusion 49 and 65. For the schematic of FIG. 8, the effective capacitance of the floating diffusion 49 and 65 is $C_g+C_s*(1-A_V)$. Here $C_g$ is the total capacitance between the floating nodes 49, 65 and ground, $C_s$ 110 is the capacitance between the electrical interconnect 68 and the shield 100. Note that if $A_V$ is too large then the effective capacitance is negative and the circuit becomes unstable.

Figure 9:
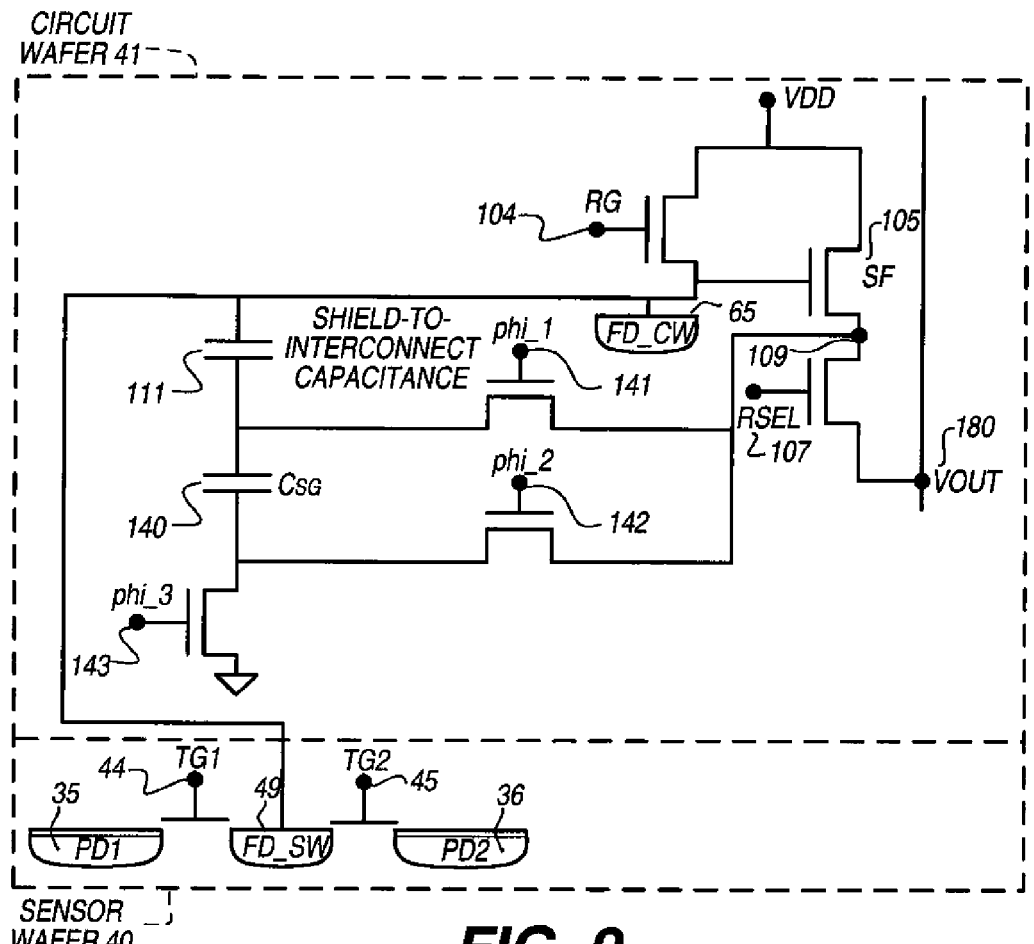
FIG. 9 shows an example of voltage amplification to the shield using a charge pump.
Figure 10:
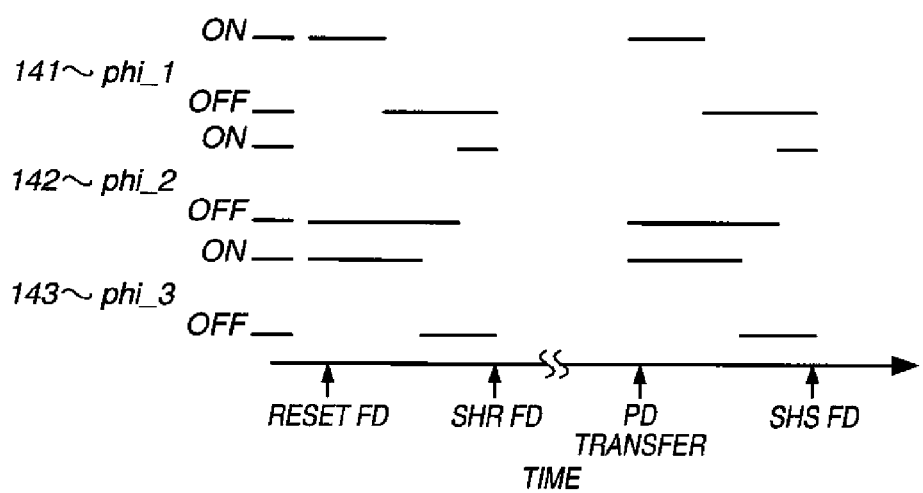
FIG. 10 is an example of the timing for clocking the switching transistors in the charge pump schematic of FIG. 11.

FIG. 9 illustrates a third embodiment. This embodiment is the same as FIG. 8 except that a charge pump 111, 140, 141, 142, 143 (the charge pump consists of the elements 111, 140, 141, 142, 143) is substituted for the amplifier 120. Charge pump 111, 140, 141, 142, 143 is small in comparison to other circuits that use operational amplifiers. This provides a gain of greater than 1, and does not require an operational amplifier. The timing for switching transistors phi_1 141, phi_2 142, and phi_3 143 is shown in FIG. 10. When charge is transferred to the floating diffusion 49 and 65, phi_1 141 and phi_3 143 are on, and phi_2 142 off. Assuming the gain of the source follower transistor is 1 then the initial output voltage from the source follower amplifier 105 is $Q_{FD}/C_{FD}$ where $Q_{FD}$ is the charge on the floating diffusion node, and $C_{FD}$ is the effective floating diffusion capacitance not including the capacitance to the shield. Next, the voltage on the shield is increased using the charge pump. First phi_1 141 is turned off, then phi_3 143 is turned off, then phi_2 142 is turned on. The output voltage from the source-follower is now $(1+C_{SH}*C_S/((C_{SH}+C_S)*C_{FD}))*Q_{FD}/C_{FD}$, where $C_{SH}$ 111 is the parasitic capacitance between the floating diffusion and the shield and $C_{SG}$ is 140. For FIG. 10, SHR and SHS stand for Sample-Hold-Reset and Sample-Hold-Sample.

Figure 11:
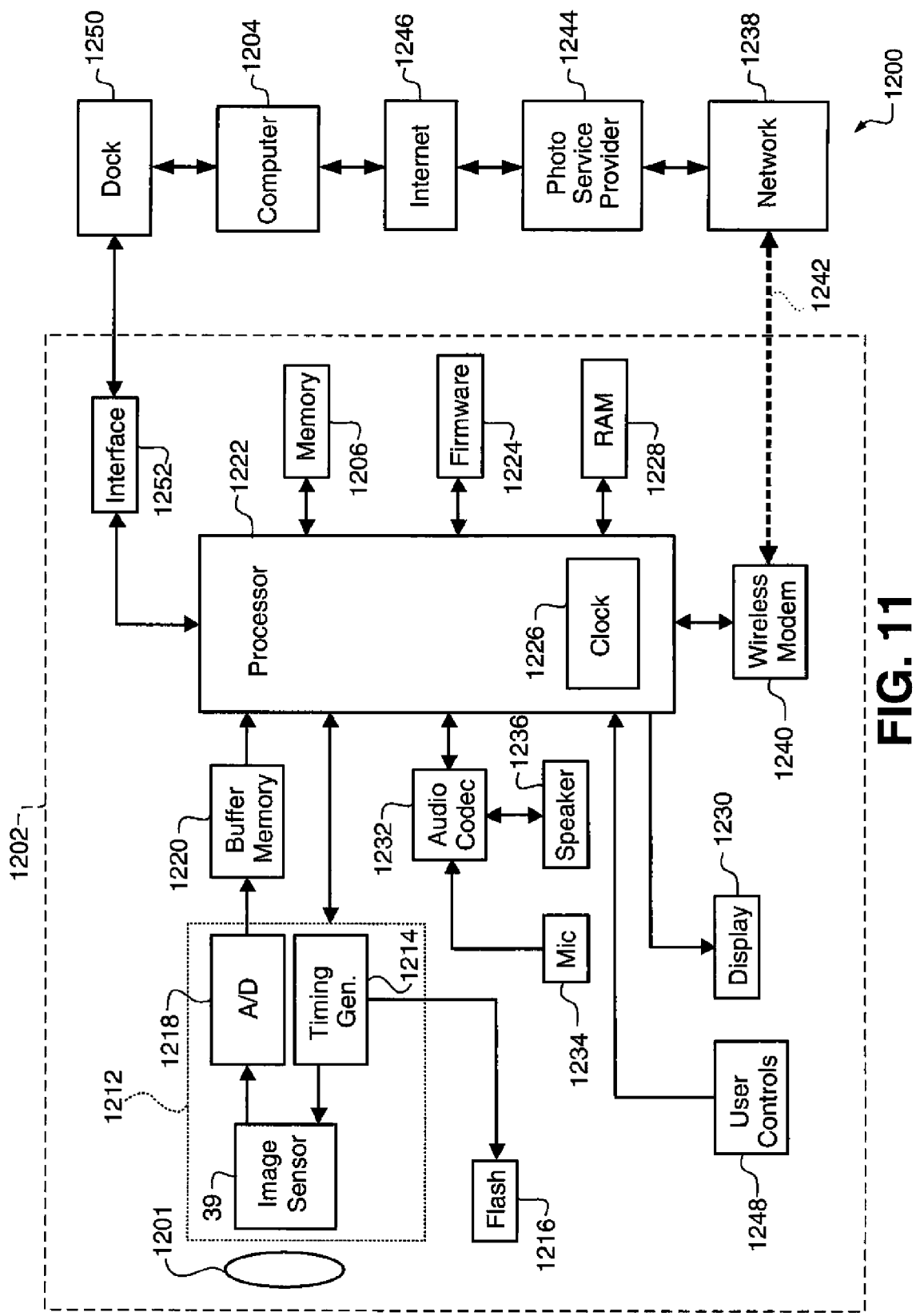
FIG. 11 is an illustration of a digital camera for illustrating a typical commercial embodiment of the present invention to which the ordinary consumer is accustomed.

FIG. 11 is a block diagram of an imaging system that can be used with the image sensor 39 of present the invention. Imaging system 1200 includes digital camera phone 1202 and computing device 1204. Digital camera phone 1202 is an example of an image capture device that can use an image sensor incorporating the present invention. Other types of image capture devices can also be used with the present invention, such as, for example, digital still cameras and digital video camcorders.

Digital camera phone 1202 is a portable, handheld, battery-operated device in an embodiment in accordance with the invention. Digital camera phone 1202 produces digital images that are stored in memory 1206, which can be, for example, an internal Flash EPROM memory or a removable memory card. Other types of digital image storage media, such as magnetic hard drives, magnetic tape, or optical disks, can alternatively be used to implement memory 1206.

Digital camera phone 1202 uses lens 1201 to focus light from a scene (not shown) onto image sensor 39 of active pixel sensor 1212. Image sensor 39 provides color image information using the Bayer color filter pattern in an embodiment in accordance with the invention. Image sensor 39 is controlled by timing generator 1214, which also controls flash 1216 in order to illuminate the scene when the ambient illumination is low.

The analog output signals output from the image sensor 39 are amplified and converted to digital data by analog-to-digital (A/D) converter circuit 1218. The digital data are stored in buffer memory 1220 and subsequently processed by digital processor 1222. Digital processor 1222 is controlled by the firmware stored in firmware memory 1224, which can be flash EPROM memory. Digital processor 1222 includes real-time clock 1226, which keeps the date and time even when digital camera phone 1202 and digital processor 1222 are in a low power state. The processed digital image files are stored in memory 1206. Memory 1206 can also store other types of data, such as, for example, music files (e.g. MP3 files), ring tones, phone numbers, calendars, and to-do lists.

In one embodiment in accordance with the invention, digital camera phone 1202 captures still images. Digital processor 1222 performs color interpolation followed by color and tone correction, in order to produce rendered sRGB image data. The rendered sRGB image data are then compressed and stored as an image file in memory 1206. By way of example only, the image data can be compressed pursuant to the JPEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Digital processor 1222 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage Of Full And Reduced Resolution Images" to Kuchta, et al. The thumbnail image is stored in RAM memory 1228 and supplied to color display 1230, which can be, for example, an active matrix LCD or organic light emitting diode (OLED). Generating thumbnail size images allows the captured images to be reviewed quickly on color display 1230.

In another embodiment in accordance with the invention, digital camera phone 1202 also produces and stores video clips. A video clip is produced by summing multiple pixels of image sensor 39 together (e.g. summing pixels of the same color within each 4 column×4 row area of the image sensor 39) to create a lower resolution video image frame. The video image frames are read from image sensor array 1210 at regular intervals, for example, using a 15 frame per second read-out rate.

Audio codec 1232 is connected to digital processor 1222 and receives an audio signal from microphone (Mic) 1234. Audio codec 1232 also provides an audio signal to speaker 1236. These components are used both for telephone conversations and to record and playback an audio track, along with a video sequence or still image.

Speaker 1236 is also used to inform the user of an incoming phone call in an embodiment in accordance with the invention. This can be done using a standard ring tone stored in firmware memory 1224, or by using a custom ring-tone downloaded from mobile phone network 1238 and stored in memory 1206. In addition, a vibration device (not shown) can be used to provide a silent (e.g. non-audible) notification of an incoming phone call.

Digital processor 1222 is connected to wireless modem 1240, which enables digital camera phone 1202 to transmit and receive information via radio frequency (RF) channel 1242. Wireless modem 1240 communicates with mobile phone network 1238 using another RF link (not shown), such as a 3GSM network. Mobile phone network 1238 communicates with photo service provider 1244, which stores digital images uploaded from digital camera phone 1202. Other devices, including computing device 1204, access these images via the Internet 1246. Mobile phone network 1238 also connects to a standard telephone network (not shown) in order to provide normal telephone service in an embodiment in accordance with the invention.

A graphical user interface (not shown) is displayed on display 1230 and controlled by user controls 1248. User controls 1248 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 1250 recharges the batteries (not shown) in digital camera phone 1202. Dock 1250 connects digital camera phone 1202 to computing device 1204 via dock interface 1252. Dock interface 1252 is implemented as wired interface, such as a USB interface, in an embodiment in accordance with the invention. Alternatively, in other embodiments in accordance with the invention, dock interface 1252 is implemented as a wireless interface, such as a Bluetooth or an IEEE 802.11b wireless interface. Dock interface 1252 is used to download images from memory 1206 to computing device 1204. Dock interface 1252 is also used to transfer calendar information from computing device 1204 to memory 1206 in digital camera phone 1202.

The invention has been described with reference to a preferred embodiment. Three other embodiments have been described. However, it will be appreciated that variations and modifications can be effected by a person of ordinary skill in the art without departing from the scope of the invention.

PARTS LIST 1 photodiode
2 transfer gate
3 floating diffusion
4 reset transistor
5 source follower amplifier
7 row select transistor
8 output line
9 output
11-14 photodiodes
15-18 transfer gates
19-22 floating diffusions
23a, 23b, 24a, 24b photodiodes
25a, 25b, 26a, 26b transfer gates
30 shielding wire
31 diffusion wire
35-38 photodiodes/photosensitive regions
39 image sensor
40 sensor wafer
41 circuit wafer
42 active layer
43 dielectric layers
44-47 transfer gates
49 charge-to-voltage conversion region/floating diffusion
51 isolation
52 electrical interconnect wire
53 metallization
54 dielectric layers
55 electrical interconnect
56 connector
57-64 metal layer
65 floating diffusion/floating nodes
67 active layer
68 electrical interconnect
70-76 metal layers
100 metal shield
101 electrical connector
104 reset gate
105 source follower amplifier
107 row select transistor
108 output line
109 output of source follower amplifier
110 charge
111, 140-143 charge pump
120 voltage amplifier 1200 imaging system
1201 lens
1202 digital camera phone
1204 computing device
1206 memory
1210 image sensor array
1212 active pixel sensor
1214 timing generator
1216 flash
1218 A/D converter circuit
1220 buffer memory
1222 digital processor
1224 firmware memory
1226 clock
1228 RAM memory
1230 color display
1232 audio codec
1234 microphone
1236 speaker
1238 mobile phone network
1240 wireless modem
1242 RF channel
1244 photo service provider
1246 Internet
1248 user controls
1250 dock
1252 dock interface

The invention claimed is:

1. An image sensor comprising:
(a) a first wafer comprising:
 (i) a photosensitive area;
 (ii) a charge-to-voltage conversion region;
(b) a second wafer comprising:
 (i) a first amplifier that receives a signal from the charge-to-voltage conversion region;
(c) an electrical interconnect connecting the charge-to-voltage conversion region to an input of the amplifier;
(d) an electrically biased shield at least partially enclosing at least a portion of the electrical interconnect.

2. The image sensor as in claim 1, wherein the electrical bias on the shield is an output from the first amplifier.

3. The image sensor as in claim 2 further comprising a second amplifier in which the input of the second amplifier is the output of the first amplifier and the output of the second amplifier biases the electrical shield.

4. The image sensor as in claim 3, wherein the second amplifier is an amplifier with a gain greater than one.

5. The image sensor as in claim 3, wherein the second amplifier is a charge pump circuit.

6. An imaging device comprising:
an image sensor comprising:
(a) a first wafer comprising:
 (i) a photosensitive area;
 (ii) a charge-to-voltage conversion region;
(b) a second wafer comprising:
 (i) a first amplifier that receives a signal from the charge-to-voltage conversion region;
(c) an electrical interconnect connecting the charge-to-voltage conversion region to an input of the amplifier;
(d) an electrically biased shield at least partially enclosing at least a portion of the electrical interconnect.

7. The imaging device as in claim 6, wherein the electrical bias on the shield is an output from the first amplifier.

8. The imaging device as in claim 7 further comprising a second amplifier in which the input of the second amplifier is the output of the first amplifier and the output of the second amplifier biases the electrical shield.

9. The imaging device as in claim 8, wherein the second amplifier is an amplifier with a gain greater than one.

10. The imaging device as in claim 8, wherein the second amplifier is a charge pump circuit.

* * * * *